(12) United States Patent
Yasuji et al.

(10) Patent No.: US 12,744,527 B2
(45) Date of Patent: Sep. 22, 2026

(54) MOTOR DRIVER CIRCUIT

(71) Applicant: ROHM CO., LTD., Kyoto (JP)

(72) Inventors: Kosuke Yasuji, Kyoto (JP); Suzunosuke Kimura, Kyoto (JP); Hiroki Sugamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 235 days.

(21) Appl. No.: 18/616,751

(22) Filed: Mar. 26, 2024

(65) Prior Publication Data

US 2024/0333284 A1 Oct. 3, 2024

(30) Foreign Application Priority Data

Mar. 28, 2023 (JP) ................................ 2023-052365

(51) Int. Cl.
*H03K 17/687* (2006.01)
*H02M 3/07* (2006.01)

(52) U.S. Cl.
CPC .......... *H03K 17/6871* (2013.01); *H02M 3/07* (2013.01); *H03K 2217/0063* (2013.01)

(58) Field of Classification Search
CPC .......... H02M 3/07; H02M 1/08; H02M 3/073; H02M 3/156; H02M 7/53871; H02M 3/33546; H02M 7/5387; H02M 1/0048; H02M 1/0041; H02M 7/797; H02M 7/219; H02M 3/077; H02M 3/076; H02M 3/33507; H02M 5/2573; H02M 3/33571; H02M 7/1557; H02M 3/33576; H03K 17/063; H03K 2217/0081; H03K 17/0822; H03K 2217/0063; H03K 17/687; H03K 2217/0036; H03K 17/04106; H03K 5/08; H03K 17/102; H03K 19/017; H03K 17/223; H03K 19/0944; H03K 3/0315;

(Continued)

(56) References Cited

U.S. PATENT DOCUMENTS

2014/0092656 A1* 4/2014 Aiura .................... H02M 3/158
363/59

FOREIGN PATENT DOCUMENTS

JP 2015056781 A * 3/2015 ............. H03K 17/06
JP 6208504 B2 9/2017

OTHER PUBLICATIONS

"Sugamoto Hiroki, Output Circuit, Circuit for Driving Output Transistor, and Electronic Apparatus, Mar. 23, 2015, Clarivate Analytics, pp. 1-32". (Year: 2015).*

* cited by examiner

*Primary Examiner* — Antony M Paul
(74) *Attorney, Agent, or Firm* — CANTOR COLBURN LLP

(57) ABSTRACT

The present disclosure provides a motor driver circuit. The motor driver circuit includes: a logic circuit, configured to generate a control signal that instructs a high-side transistor to turn on or off; and a high-side driver, configured to drive the high-side transistor according to the control signal. The high-side driver includes: a charge pump circuit, configured to generate a boosted voltage according to a clock signal and supply the boosted voltage to a gate of the high-side transistor; a charging control circuit, configured to stop supplying the clock signal to the charge pump circuit after the control signal instructs the high-side transistor to turn on and after a charging period has elapsed; and a turn-off circuit, configured to reduce a voltage at the gate of the high-side transistor when the control signal instructs the high-side transistor to turn off.

9 Claims, 9 Drawing Sheets

(58) Field of Classification Search
CPC . H03K 5/135; H02P 27/06; H02P 6/24; H02P 25/064; H02P 27/04; H02P 25/022; H02P 2207/01; H02P 27/08; H02P 25/062; H02P 6/085; H02P 2201/09; H02P 2207/05; H02K 11/33
See application file for complete search history.

MOTOR DRIVER CIRCUIT

CROSS REFERENCE TO RELATED APPLICATIONS

The present invention claims priority under 35 U.S.C. § 119 to Japanese Application No. 2023-052365, filed on Mar. 28, 2023, the entire contents of which being incorporated herein by reference.

TECHNICAL FIELD

The present disclosure relates to a motor driver circuit.

BACKGROUND

A motor driver circuit includes a bridge circuit connected to a coil of a motor. The bridge circuit includes a branch including a high-side arm and a low-side arm. The high-side arm and the low-side arm have a power transistor and a flywheel diode connected in parallel.

Each branch is capable of switching among three states, that is, a high output state in which a high-side transistor is turned on and a low-side transistor is turned off, a low output state in which the high-side transistor is turned off and the low-side transistor is turned on, and a high impedance state in which both of the high-side transistor and the low-side transistor are turned off.

PRIOR ART DOCUMENT

Patent Publication

[Patent document 1] Japan Patent Publication No. 6208504

DETAILED DESCRIPTION OF THE EMBODIMENTS

Summary of Embodiments

Figure 1:
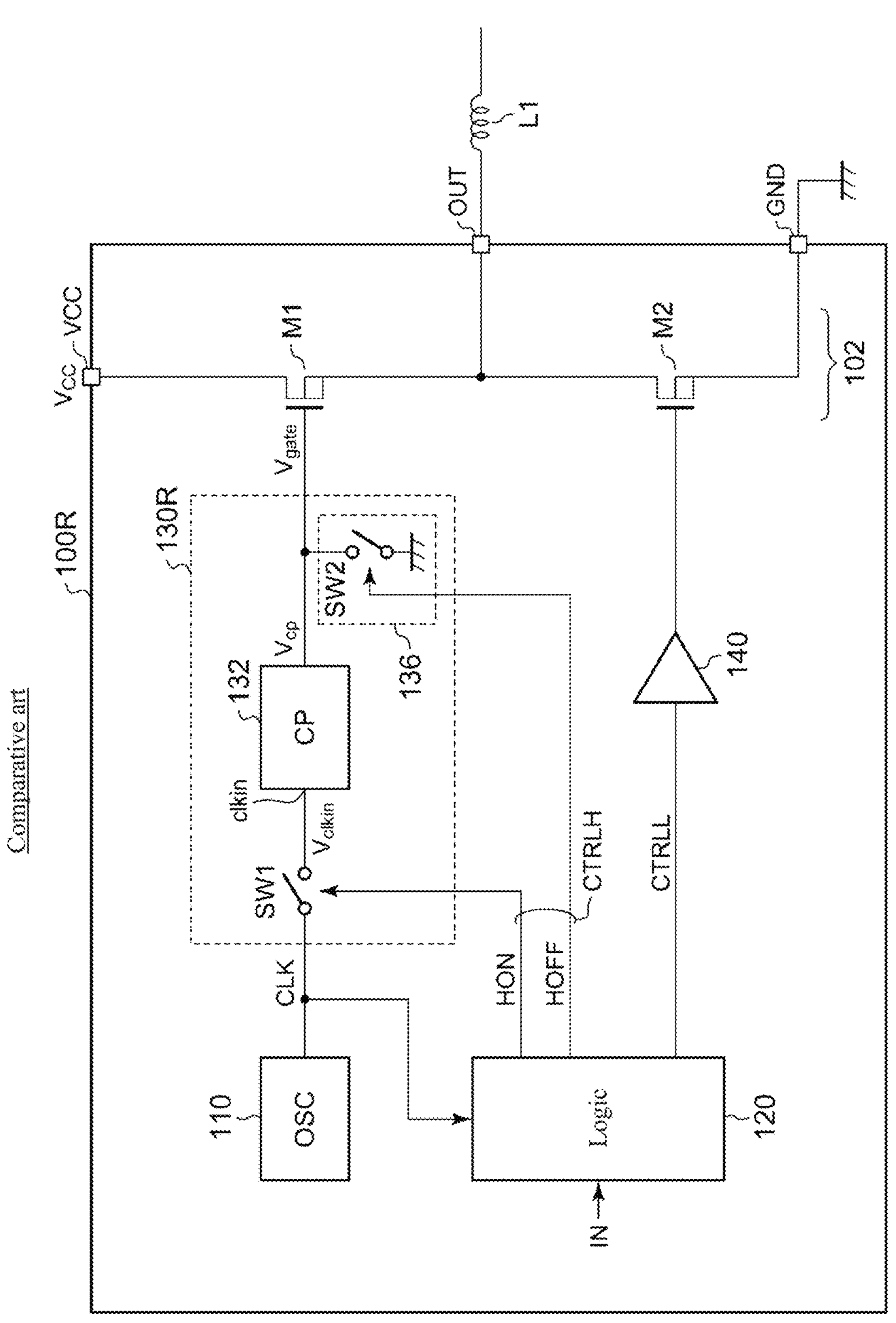
FIG. 1 is a circuit diagram of a motor driver circuit of the comparative art.

A summary of several exemplary embodiments of the present disclosure is described below. The summary serves as the preamble of the detailed description provided below and aims to provide fundamental understanding of the embodiments by describing several concepts of one or more embodiments in brief. It should be noted that the summary is not to be construed as limitations to the breadth of the application or disclosure. The summary is not a comprehensive summary of all conceivable embodiments, nor does it intend to specify important elements of all embodiments or to define the scope of a part of or all forms. For the sake of better description, "one embodiment" sometimes refers to one embodiment (an implementation example or a variation example) or multiple embodiments (implementation examples or variation examples) disclosed in the disclosure.

A motor driver circuit according to an embodiment includes: a logic circuit, configured to generate a control signal that instructs a high-side transistor to turn on or off; and a high-side driver, configured to drive the high-side transistor according to the control signal. The high-side driver includes: a charge pump circuit, configured to generate a boosted voltage according to a clock signal and supply the boosted voltage to a gate of the high-side transistor; a charging control circuit, configured to stop supplying the clock signal to the charge pump circuit after the control signal instructs the high-side transistor to turn on and after a charging period has elapsed; and a turn-off circuit, configured to reduce a voltage at the gate of the high-side transistor when the control signal instructs the high-side transistor to turn off.

The charging period is set to be longer than a time until a gate-source voltage of the high-side transistor exceeds a gate threshold voltage of the transistor when the high-side transistor is turned on. Moreover, by operating the charge pump circuit only during the charging period and stopping the charge pump circuit after the charging period has elapsed, switching loss of the charge pump circuit can be reduced and high-efficiency operations can be performed.

In one embodiment, the charging control circuit can also end the charging period when a predetermined time has elapsed after the control signal instructs the high-side transistor to turn on.

In one embodiment, the charging control circuit can also end the charging period when the voltage at the gate of the high-side transistor reaches a predetermined level.

In one embodiment, the motor driver circuit can further include: an oscillator, configured to generate the clock signal; and a first switch, connected between an output node of the oscillator and a clock input node of the charge pump circuit. The charging control circuit can also be configured to control the first switch.

In one embodiment, the motor driver circuit can further include an oscillator configured to generate the clock signal. The charging control circuit can also be configured to control the oscillator to turn on and off.

In one embodiment, the turn-off circuit can further include a second switch connected between the gate of the high-side transistor and a ground, or between the gate and a source of the high-side transistor.

In one embodiment, the charge pump circuit can further include a reference input node and is configured to be outputtable a voltage greater than the voltage supplied to the reference input node by a predetermined voltage in response to the clock signal. The motor driver circuit can further include a third switch connected between the reference input node of the charge pump circuit and a drain of the high-side transistor. The charge control circuit turns on the third switch when the control signal instructs the high-side transistor to turn on, and then starts supplying the clock signal to the charge pump circuit. After the charging period has elapsed, the supply of the clock signal to the charge pump circuit is stopped. Accordingly, the high-side transistor can be turned on at a high speed, and the number of times of switching of the charge pump circuit can be reduced, hence further reducing power consumption.

In one embodiment, the motor driver circuit can also be integrated on one semiconductor substrate. The so-called "integrated" includes a situation in which all constituting elements of a circuit are formed on a semiconductor substrate, or a situation in which main constituting elements of a circuit are integrated. In addition, a part of resistors or capacitors can be arranged outside the semiconductor substrate and be used to adjust circuit constants. By integrating circuits on one chip, the circuit area can be reduced, and characteristics of circuit elements can be kept uniform.

EMBODIMENTS

Details of preferred embodiments are provided with the accompanying drawings below. The same or equivalent constituent elements, parts and processes in the accompanying drawings are represented by the same denotations, and repeated description is omitted as appropriate. Moreover, the embodiments are illustrative of and are not restrictive of the disclosure. All features and combinations thereof described in the embodiments are not necessarily intrinsic characteristics of the disclosure.

In the description of the present application, an expression "a state of a component A connected to a component B" includes a situation where the component A and the component B are physically directly connected, or a situation where the component A is indirectly connected to the component B via another component, provided that the indirect connection does not result in substantial influences on their electrical connection or does not impair functions or effects exerted by their connection.

Similarly, an expression "a state of a component C arranged between a component A and a component B" also includes, in addition to a situation where the component A and the component C, or the component B and the component C are directly connected, an indirect connection via another component, provided that the indirect connection does not result in substantial influences on their electrical connection or does not impair functions or effects exerted by their connection.

Moreover, the vertical axis and horizontal axis in the waveform diagrams or timing diagrams referenced in the present application are appropriately scaled up or scaled down for better understanding, and the waveforms are also simplified for better understanding.

A motor driver circuit of a comparative art is illustrated before a motor driver circuit of an embodiment is described.

FIG. 1 shows a circuit diagram of a motor driver circuit 100R of the comparative art.

The motor driver circuit 100R includes a branch 102 of an inverter circuit, an oscillator 110, a logic circuit 120, a high-side driver 130R and a low-side driver 140. A coil L of a motor which is a driving target is connected to an output pin OUT. A power supply voltage $V_{CC}$ is supplied to a power supply pin VCC, and a ground pin GND is grounded.

The branch 102 includes a high-side transistor M1 serving as an upper arm and a low-side transistor M2 serving as a lower arm.

The oscillator 110 generates a clock signal CLK. The clock signal CLK can be a system clock of the motor driver circuit 100R and is supplied to the logic circuit 120.

The logic circuit 120 generates, according to an input signal IN, a control signal CTRLH instructing the high-side transistor M1 to turn on and off. Moreover, the logic circuit 120 generates, according to an input signal IN, a control signal CTRLL instructing the low-side transistor M2 to turn on and off.

The high-side driver 130R drives the high-side transistor M1 according to the control signal CTRLH. The low-side driver 140 drives the low-side transistor M2 according to the control signal CTRLL.

The high-side driver 130R includes a charge pump circuit 132, a first switch SW1 and a turn-off circuit 136. The charge pump circuit 132 switches according to a clock signal Vclkin supplied to a clock input node clkin and generates a boosted voltage $V_{CP}$. The boosted voltage $V_{CP}$ is supplied to a gate of the high-side transistor M1. The charge pump circuit 132 can be implemented by a 2× boost or 3× boost charge pump circuit or can be implemented by a voltage addition charge pump circuit.

The first switch SW1 is disposed between the clock input node clkin of the charge pump circuit 132 and an output node of the oscillator 110.

The control signal CTRLH includes a high-side turn-on signal HON and a high-side turn-off signal HOFF. The high-side turn-on signal HON is a signal that is asserted (for example, high) during an on-period of the high-side transistor M1, and a low-side turn-on signal LON is a signal that is asserted (for example, high) during an off-period of the high-side transistor M1.

The first switch SW1 is turned on during an assertion period of the high-side turn-on signal HON. Accordingly, the charge pump circuit 132 performs a charge pump operation, the boosted voltage $V_{CP}$ is supplied to the gate of the high-side transistor M1, and the high-side transistor M1 becomes turned on.

When the control signal CTRLH instructs the high-side transistor M1 to turn off, the turn-off circuit 136 causes a decrease in a voltage $V_{gate}$ at the gate of the high-side transistor M1. The turn-off circuit 136 includes a second switch SW2 that is turned on during an assertion period of the high-side turn-off signal HOFF. The second switch SW2 is connected between the gate of the high-side transistor M1 and a ground. During an on-period of the second switch SW2, charge in a gate capacitor of the high-side transistor M1 is discharged, the gate voltage $V_{gate}$ decreases, and the high-side transistor M1 becomes turned off.

Figure 2:
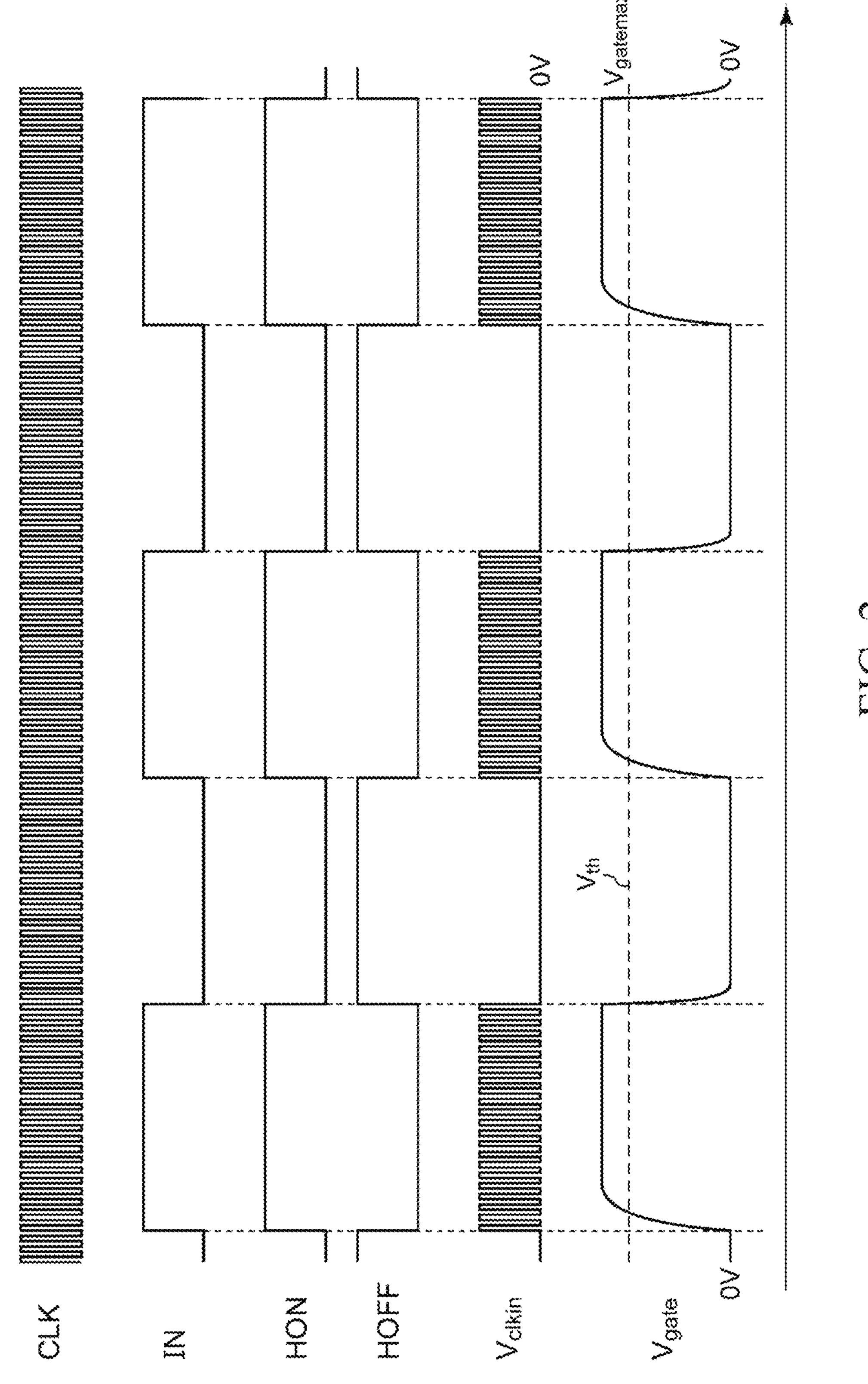
FIG. 2 is a waveform diagram of the operation of the motor driver circuit in FIG. 1.

The configuration of the motor driver circuit 100R is as described above. The operation of the motor driver circuit 100R is described below. FIG. 2 shows a waveform diagram of the operation of the motor driver circuit 100R in FIG. 1. During a high period of the input signal IN, the high-side turn-on signal HON changes to high, and the first switch SW1 is turned on. Accordingly, the clock signal CLK is supplied to the clock input node clkin of the charge pump circuit 132. The charge pump circuit 132 performs a charge pump operation according to the clock signal Vclkin to cause the gate voltage $V_{gate}$ of the high-side transistor M1 to increase to a voltage level $V_{gatemax}$ higher than a threshold voltage $V_{th}$ of the high-side transistor M1 that is turned on. Accordingly, the high-side transistor M1 is turned on. The threshold voltage $V_{th}$ is represented by an equation below:

$$V_{th} = V_{CC} + V_{gs(th)},$$

where $V_{gs(th)}$ is a gate threshold voltage of a MOSFET.

During a high period of the high-side turn-on signal HON, the clock signal Vclkin is supplied to the clock input node clkin of the charge pump circuit 132, and the charge pump circuit 132 continues switching.

When the input signal IN changes to low, the high-side turn-off signal HOFF changes to high, and the first switch SW1 is turned off and the turn-off circuit 136 is turned on. Accordingly, the gate voltage $V_{gate}$ of the high-side transistor M1 decreases to 0 V, and the high-side transistor M1 is turned off.

The operation of the motor driver circuit 100R is as described above. In the motor driver circuit 100R, the charge pump circuit 132 continues switching during an on-period of the high-side transistor M1. Thus, switching loss is generated, causing an issue of increased power consumption of the motor driver circuit 100R.

In the motor driver circuit 100 of several embodiments described below, the issue above is solved.

First Embodiment

Figure 3:
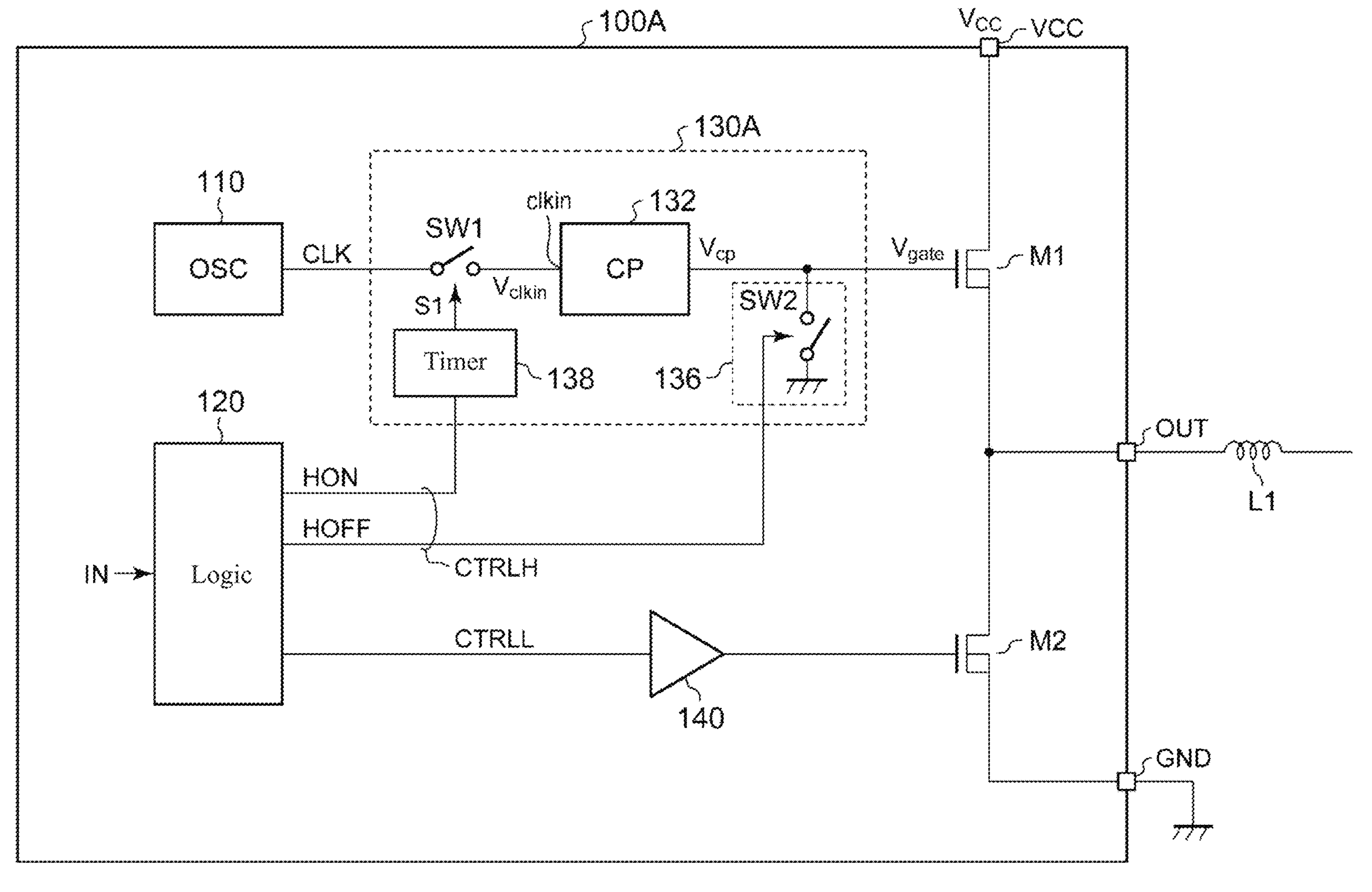
FIG. 3 is a circuit diagram of a motor driver circuit according to a first embodiment.

FIG. 3 shows a circuit diagram of a motor driver circuit 100A according to the first embodiment. In addition to the high-side driver 130R in FIG. 1, a high-side driver 130A of the motor driver circuit 100A further includes a charging control circuit 138A. The motor driver circuit 100A is an integrated circuit (IC) integrated on a semiconductor substrate.

The charging control circuit 138A asserts (for example, setting to high) the control signal S1 and thus sets the first switch SW1 to be turned on during a charging period $T_{CHG}$ after the control signal CTRLH instructs the high-side transistor M1 to turn on, and negates (for example, setting to low) the control signal S1 and thus sets the first switch SW1 to be turned off after the charging period $T_{CHG}$ has elapsed. As a result, during the charging period $T_{CHG}$, the clock signal Vclkin is supplied to the charge pump circuit 132, and then supplying of the clock signal Vclkin is stopped.

In the first embodiment, the charging control circuit 138A is a timer circuit. The charging control circuit 138A ends the charging period $T_{CHG}$ when a predetermined time $T_{TIMER}$ has elapsed after the control signal CTRLH (the high-side turn-on signal HON) instructs the high-side transistor M1 to turn on. The predetermined time $T_{TIMER}$ is set to be longer than a time until an output voltage $V_{CP}$ of the charge pump circuit 132 reaches a maximum level $V_{gatemax}$. The maximum level $V_{gatemax}$ is set to be higher than the threshold $V_{th}=V_{CC}+V_{gs(th)}$.

Figure 4:
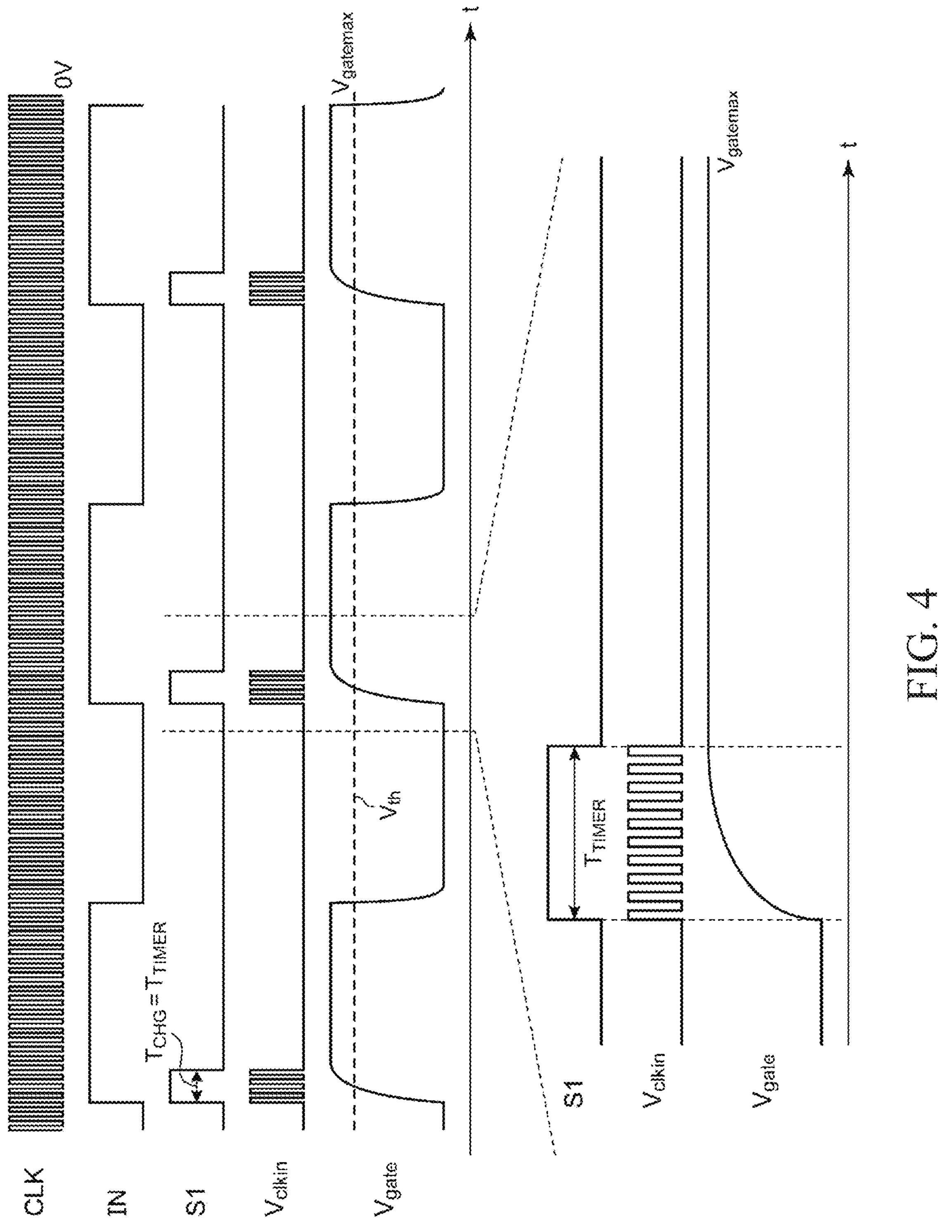
FIG. 4 is a waveform diagram of the operation of the motor driver circuit in FIG. 3.

The configuration of the motor driver circuit 100A is as described above. The operation of the motor driver circuit 100A is described below. FIG. 4 shows a waveform diagram of the operation of the motor driver circuit 100A in FIG. 3.

In the motor driver circuit 100A in FIG. 3, after the input signal IN changes to high, the charge pump circuit 132 accordingly operates only in the charging period $T_{CHG}$ determined by the timer time $T_{TIMER}$, and the charge pump circuit 132 stops operating after the charging period $T_{CHG}$ has elapsed. Accordingly, compared to the comparative art, switching loss of the charge pump circuit 132 is reduced, hence improving efficiency.

Second Embodiment

Figure 5:
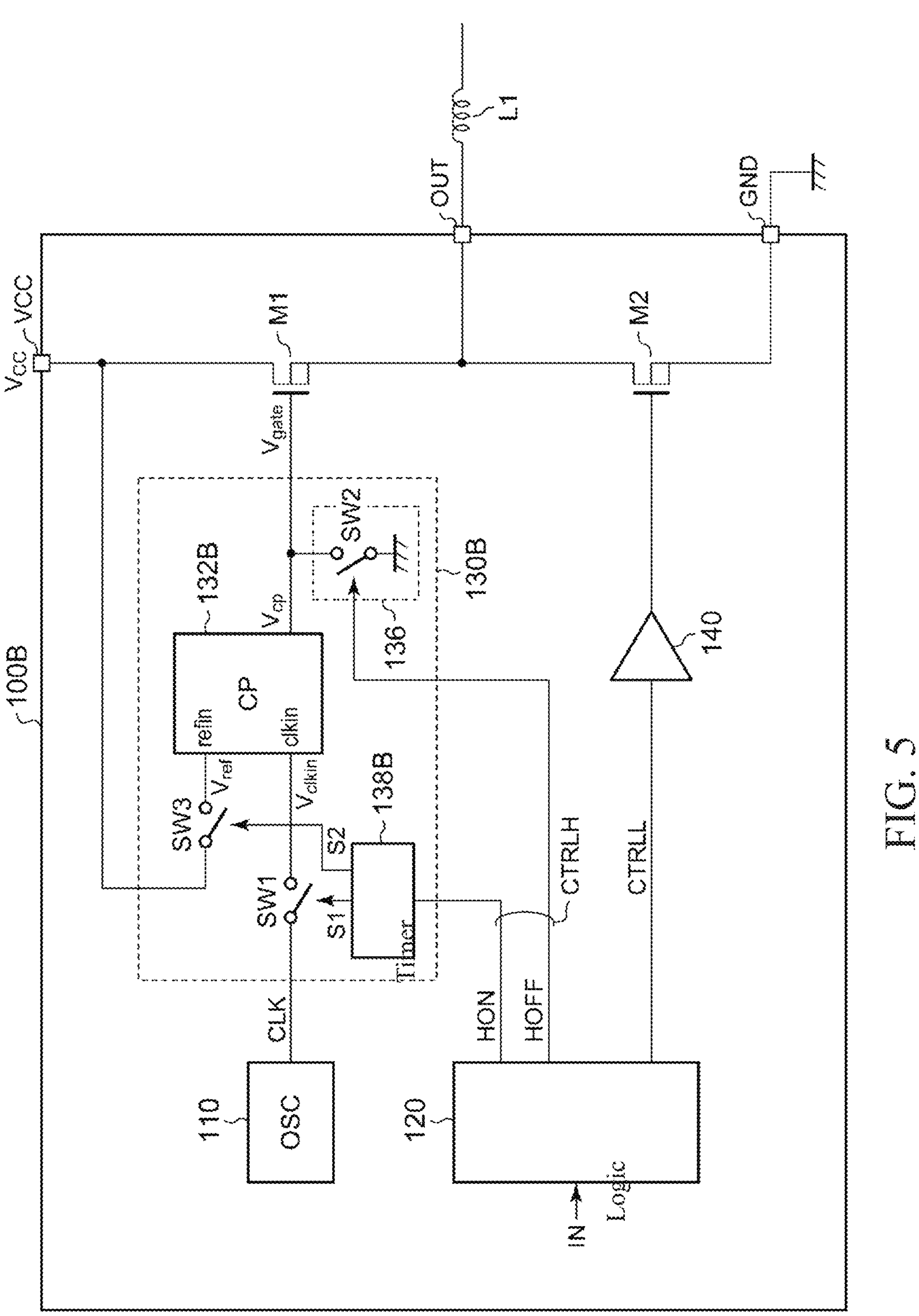
FIG. 5 is a circuit diagram of a motor driver circuit according to a second embodiment.

FIG. 5 shows a circuit diagram of a motor driver circuit 100B according to the second embodiment. In the motor driver circuit 100B, a high-side driver 130B further includes a third switch SW3.

A charge pump circuit 132B is a voltage addition charge pump circuit, and in addition to the clock input node clkin, further includes a reference input node refin. The charge pump circuit 132B is configured to be outputtable a boosted voltage $V_{CP}$ greater than a voltage $V_{ref}$ supplied to the reference input node refin by a predetermined voltage ΔV in response to the clock signal Vclkin.

$$V_{CP} = V_{ref} + \cdot \Delta V$$

The third switch SW3 is connected to a $V_{CC}$ pin, that is, between a drain of the high-side transistor M1 and the reference input node refin of the charge pump circuit 132B.

A charging control circuit 138B generates control signals S1 and S2 indicating states of the first switch SW1 and the third switch SW3. The charging control circuit 138B immediately turns on the third switch SW3 in response to an instruction for turning on the high-side transistor M1 (the high-side turn-on signal HON is asserted). Then, the first switch SW1 is turned on after a predetermined time $T_{TIMER1}$ has elapsed. Then, after a predetermined time $T_{TIMER2}$ has elapsed, in other words, while the charging period $T_{CHG}$ ends, the first switch SW1 is turned off, and supplying of the clock signal CLK to the charge pump circuit 132B is stopped. Moreover, while the charging period $T_{CHG}$ ends, the charging control circuit 138B turns off the third switch SW3.

Figure 6:
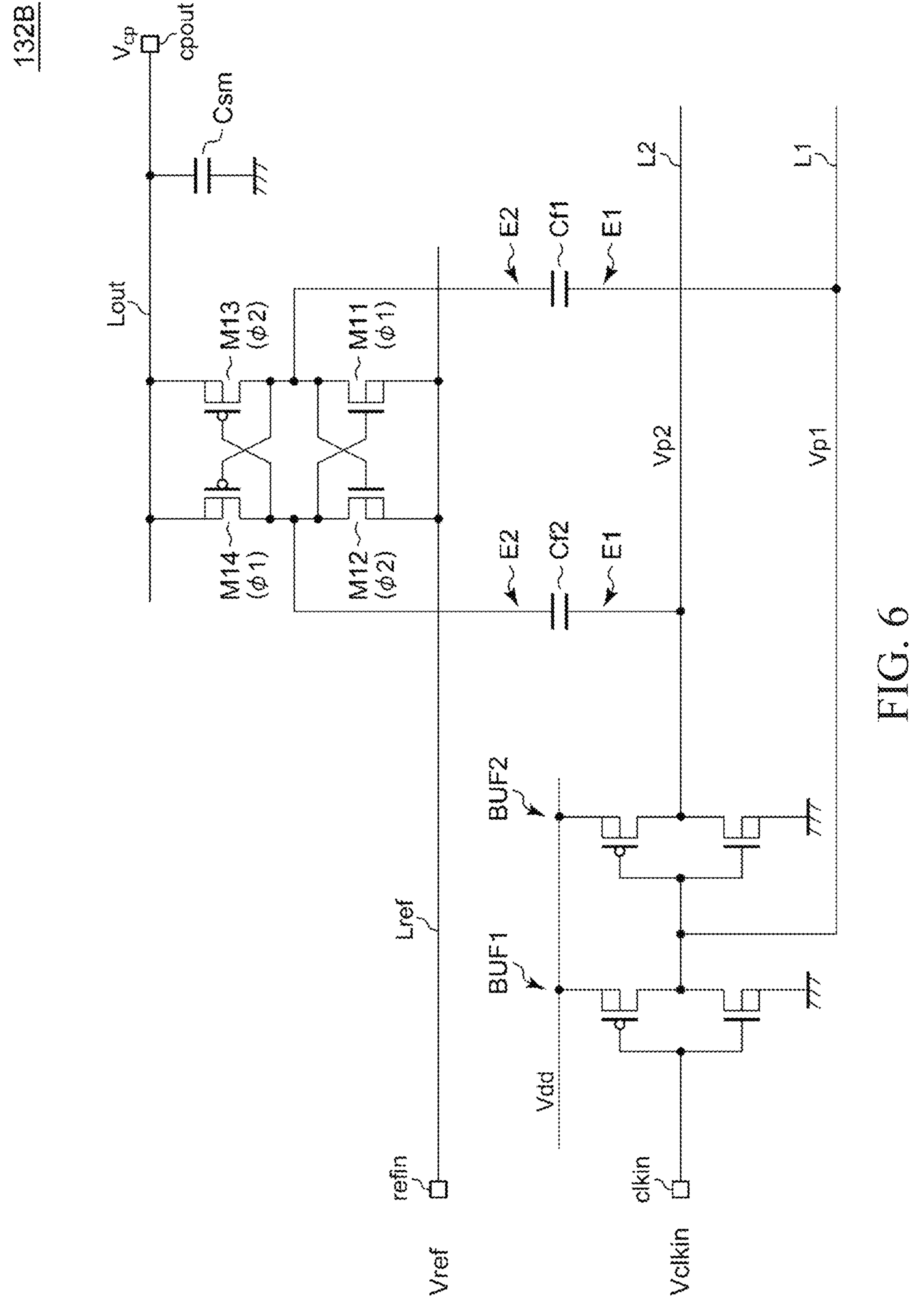
FIG. 6 is a circuit diagram of a configuration example of a charge pump circuit.

FIG. 6 shows a circuit diagram of a configuration example of the charge pump circuit 132B. The charge pump circuit 132B includes buffer circuits BUF1 and BUF2, flying capacitors Cf1 and Cf2, transistors M11 to M14, and an output capacitor (a smoothing capacitor) Csm.

The buffers BUF1 and BUF2 are inverters to which a power supply voltage Vdd is supplied. The buffer BUF1 generates a first pulse signal Vp1 having an amplitude of Vdd on a first line L1 according to the clock input Vclkin. Moreover, the buffer BUF2 generates a second pulse signal Vp2 having an amplitude of Vdd on a second line L2 according to an output of the buffer BUF1. The first pulse signal Vp1 and the second pulse signal Vp2 are in inverse phases from each other.

A first end E1 of the first flying capacitor Cf1 is connected to the first line L1, and a first end E1 of the second flying capacitor Cf2 is connected to the second line L2. The first transistor M11 is connected between a reference line Lref and a second end E2 of the first flying capacitor Cf1. The second transistor M12 is connected between the reference line Lref and a second end E2 of the second flying capacitor Cf2. The third transistor M13 is connected between an output line Lout and the second end E2 of the first flying capacitor Cf1. The fourth transistor M14 is connected between the output line Lout and the second end E2 of the second flying capacitor Cf2. A gate of each of the first transistor M11 and the third transistor M13 is connected to the second end E2 of the second flying capacitor Cf2. A gate of each of the second transistor M12 and the fourth transistor M14 is connected to the second end E2 of the first flying capacitor Cf1.

The output voltage $V_{CP}$ of the charge pump circuit 132B is represented by:

$$V_{CP} = V_{ref} + VDD$$

The configuration of the charge pump circuit 132B is as described above.

Figure 7:
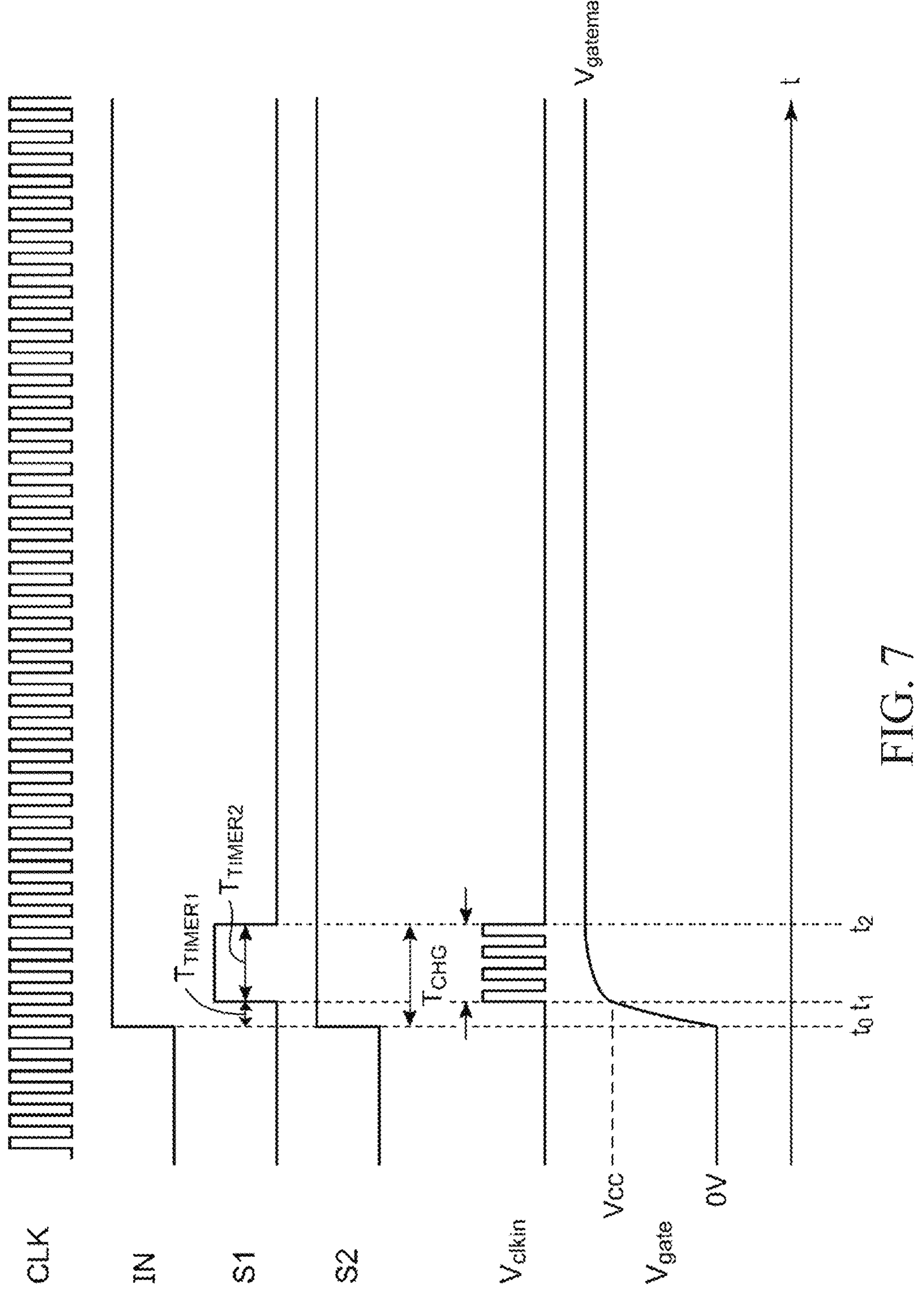
FIG. 7 is a waveform diagram of the operation of the motor driver circuit in FIG. 5.

FIG. 7 shows a waveform diagram of the operation of the motor driver circuit 100B in FIG. 5.

When the input signal IN changes to high at a timing to, the control signal S2 changes to high, and the third switch SW3 is turned on. Accordingly, the voltage $V_{CC}$ is supplied to the reference input node refin of the charge pump circuit 132B, and the output voltage $V_{CP}$ of the charge pump circuit 132B rapidly increases to the power supply voltage $V_{CC}$.

At a timing $t_1$ after the predetermined time $T_{TIMER1}$ has elapsed from the timing to, the control signal S1 changes to high, the clock signal Vclkin is supplied to the clock input node clkin of the charge pump circuit 132B, and the charge pump circuit 132B starts a charge pump operation. With the charge pump operation, the output voltage $V_{CP}$ of the charge pump circuit 132B increases to the maximum level $V_{gatemax}$. Then, when the charging period $T_{CHG}$ ends at a timing $t_2$, the control signal S1 changes to low.

The operation of the motor driver circuit 100B is as described above. According to the motor driver circuit 100B, during a period between timings to and $t_1$, the gate voltage $V_{gate}$ of the high-side transistor M1 is caused to increase rapidly to the power supply voltage $V_{CC}$, and then rises to the maximum level $V_{gatemax}$ by the charge pump operation. Accordingly, compared to the first embodiment, the high-side transistor M1 can be turned on within a short period of time. Moreover, since a period in which the charge pump circuit 132B performs a charge pump operation can be reduced, power consumption can be further decreased.

Figure 8:
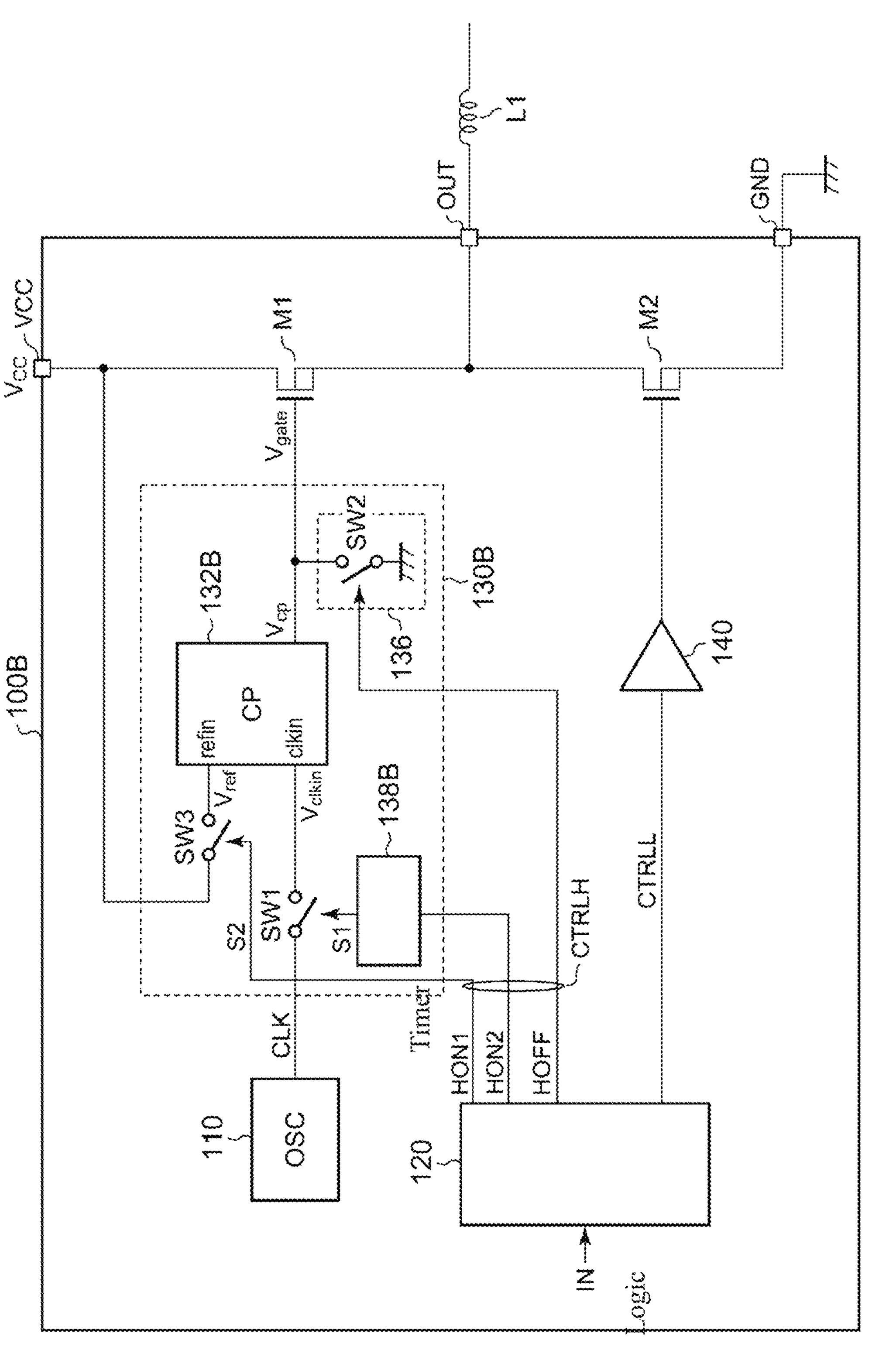
FIG. 8 is a circuit diagram of a variation example of the motor driver circuit in FIG. 5.

FIG. 8 shows a circuit diagram of a variation example of the motor driver circuit 100B in FIG. 5. In the variation example, the control signal CTRLH generated by the logic circuit 120 includes signals HON1, HON2 and HOFF. The signal HON1 is a signal asserted during an on-period of the high-side transistor M1 and is the control signal S2 for the third switch SW3.

The signal HON2 is a signal specifying a timing at which the first switch SW1 should be turned on. The charging control circuit 138B sets the control signal S1 to high in response to assertion of the signal HON2 and turns on the first switch SW1. Then, a timer operation starts, and when the charging period $T_{CHG}$ is complete, the control signal S1 is set to low and the first switch SW1 is turned off.

Third Embodiment

Figure 9:
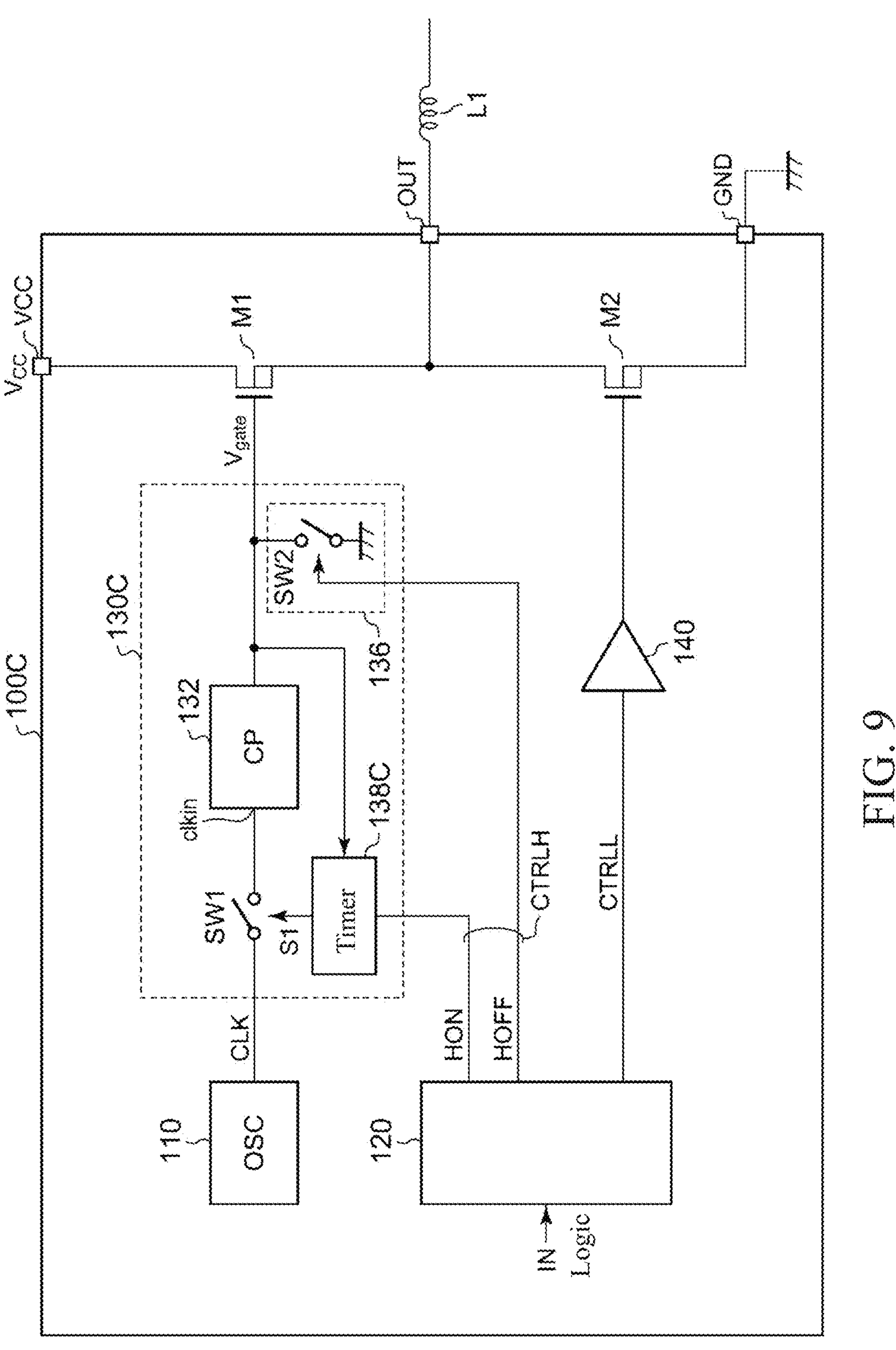
FIG. 9 is a circuit diagram of a motor driver circuit according to a third embodiment.

FIG. 9 shows a circuit diagram of a motor driver circuit 100C according to the third embodiment. In the first and second embodiments, each of the charging control circuit 138A and 138B is formed by a timer circuit. However, in the third embodiment, a charging control circuit 138C has a different configuration.

The charging control circuit 138C monitors the gate voltage $V_{gate}$ of the high-side transistor M1 and ends the charging period $T_{CHG}$ when the gate voltage $V_{gate}$ reaches a predetermined level. The charging control circuit 138C can compare the gate voltage $V_{gate}$ of the high-side transistor M1 with a reference level or can compare the gate-source voltage of the high-side transistor M1 with a reference level. The charging control circuit 138C can be implemented by a comparison mechanism such as a voltage comparator.

Variation Examples

Next, several variation examples are described below.

Variation Example 1

The second switch SW2 of the turn-off circuit 136 can be disposed between the gate and the source of the high-side transistor M1.

Variation Example 2

In the embodiments, the high-side transistor M1 and the low-side transistor M2 are built in the motor driver circuit 100; however, they can also be external discrete components. When the high-side transistor M1 and the low-side transistor M2 are discrete components, preferably, the duration of the charging period is adjustable according to the gate capacitor, and for the motor driver circuits 100A and 100B of the first and second embodiments, the time of the timer circuits can be set externally.

Variation Example 3

In the embodiments, supplying of the clock signal to the charge pump circuit 132 is performed or stopped according to on and off of the first switch SW1; however, the present disclosure is not limited to the example above. When an oscillator generating a clock for the logic circuit 120 and an oscillator generating a clock for the charge pump circuit are separate, the charging control circuit 138 can also control on and off of the oscillator for the charge pump circuit.

(Note)

The following technology is disclosed in the present disclosure.

(Item 1)

A motor driver circuit, comprising:

a logic circuit, configured to generate a control signal that instructs a high-side transistor to turn on or off, and a high-side driver, configured to drive the high-side transistor according to the control signal, wherein the high-side driver includes:

a charge pump circuit, configured to generate a boosted voltage according to a clock signal and supply the boosted voltage to a gate of the high-side transistor;

a charging control circuit, configured to stop supplying the clock signal to the charge pump circuit after the control signal instructs the high-side transistor to turn on and after a charging period has elapsed; and a turn-off circuit, configured to reduce a voltage at the gate of the high-side transistor when the control signal instructs the high-side transistor to turn off.

(Item 2)

The motor driver circuit of Item 1, comprising:

an oscillator, configured to generate the clock signal; and a first switch, connected between an output node of the oscillator and an input node of a clock of the charge pump circuit, wherein the charging control circuit is configured to control the first switch.

(Item 3)

The motor driver circuit of Item 1 or 2, wherein the charging control circuit is configured to end the charging period when a predetermined time has elapsed since the control signal instructed to turn on the high-side transistor.

(Item 4)

The motor driver circuit of Item 1 or 2, wherein the charging control circuit is configured to end the charging period when the voltage at the gate of the high-side transistor reaches a predetermined level.

(Item 5)

The motor driver circuit of any one of Items 1 to 4, wherein the turn-off circuit includes a second switch connected between the gate of the high-side transistor and a ground, or between the gate and a source of the high-side transistor.

(Item 6)

The motor driver circuit of any one of Items 1 to 5, wherein the charge pump circuit includes a reference input node and is configured to be outputtable a voltage greater than the voltage supplied to the reference input node by a predetermined voltage in response to the clock signal, the motor driver circuit further comprises a third switch connected between the reference input node of the charge pump circuit and a drain of the high-side transistor, the charging control circuit is configured to turn on the third switch when the control signal instructs the high-side transistor to turn on, and then start supplying the clock signal to the charge pump circuit, and after the charging period has elapsed, the supply of the clock signal to the charge pump circuit is stopped.

(Item 7)

The motor driver circuit of any one of Items 1 to 6, wherein the motor driver circuit is integrated on one semiconductor substrate.

The invention claimed is:

1. A motor driver circuit, comprising:

a logic circuit, configured to generate a control signal that instructs a high-side transistor to turn on or off; and a high-side driver, configured to drive the high-side transistor according to the control signal, wherein the high-side driver includes:

a charge pump circuit, configured to generate a boosted voltage according to a clock signal and supply the boosted voltage to a gate of the high-side transistor;

a charging control circuit, configured to stop supplying the clock signal to the charge pump circuit after the control signal instructs the high-side transistor to turn on and after a charging period has elapsed; and a turn-off circuit, configured to reduce a voltage at the gate of the high-side transistor when the control signal instructs the high-side transistor to turn off, wherein the turn-off circuit includes a second switch connected between the gate of the high-side transistor and a ground, or between the gate and a source of the high-side transistor.

2. The motor driver circuit of claim 1, comprising:

an oscillator, configured to generate the clock signal; and a first switch, connected between an output node of the oscillator and an input node of a clock of the charge pump circuit, wherein the charging control circuit is configured to control the first switch.

3. The motor driver circuit of claim 2, wherein the charging control circuit is configured to end the charging period when a predetermined time has elapsed since the control signal instructed to turn on the high-side transistor.

4. The motor driver circuit of claim 2, wherein the charging control circuit is configured to end the charging period when the voltage at the gate of the high-side transistor reaches a predetermined level.

5. The motor driver circuit of claim 2, wherein the motor driver circuit is integrated on one semiconductor substrate.

6. The motor driver circuit of claim 1, wherein the charging control circuit is configured to end the charging period when a predetermined time has elapsed since the control signal instructed to turn on the high-side transistor.

7. The motor driver circuit of claim 1, wherein the charging control circuit is configured to end the charging period when the voltage at the gate of the high-side transistor reaches a predetermined level.

8. The motor driver circuit of claim 1, wherein the motor driver circuit is integrated on one semiconductor substrate.

9. A motor driver circuit, comprising:

a logic circuit, configured to generate a control signal that instructs a high-side transistor to turn on or off; and a high-side driver, configured to drive the high-side transistor according to the control signal, wherein the high-side driver includes:

a charge pump circuit, configured to generate a boosted voltage according to a clock signal and supply the boosted voltage to a gate of the high-side transistor;

a charging control circuit, configured to stop supplying the clock signal to the charge pump circuit after the control signal instructs the high-side transistor to turn on and after a charging period has elapsed; and a turn-off circuit, configured to reduce a voltage at the gate of the high-side transistor when the control signal instructs the high-side transistor to turn off, wherein the charge pump circuit includes a reference input node and is configured to be outputtable a voltage greater than the voltage supplied to the reference input node by a predetermined voltage in response to the clock signal, the motor driver circuit further comprises a third switch connected between the reference input node of the charge pump circuit and a drain of the high-side transistor, the charging control circuit is configured to turn on the third switch when the control signal instructs the high-side transistor to turn on, and then start supplying the clock signal to the charge pump circuit, and after the charging period has elapsed, the supply of the clock signal to the charge pump circuit is stopped.

* * * * *